(12) United States Patent
Stoddard

(10) Patent No.: US 6,252,177 B1
(45) Date of Patent: Jun. 26, 2001

(54) LOW INDUCTANCE CAPACITOR MOUNTING STRUCTURE FOR CAPACITORS OF A PRINTED CIRCUIT BOARD

(75) Inventor: D. Joe Stoddard, Houston, TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/025,670

(22) Filed: Feb. 18, 1998

(51) Int. Cl.$^7$ ..................................................... H05K 1/16
(52) U.S. Cl. .................... 174/260; 361/306.2; 361/309; 361/310; 361/782
(58) Field of Search ............................... 361/774, 306.2, 361/309, 310, 782; 174/260

(56) References Cited

U.S. PATENT DOCUMENTS

| | | | |
|---|---|---|---|
| 3,302,067 | 1/1967 | Jackson et al. | 317/101 |
| 4,130,722 | 12/1978 | Levijoki | 174/68.5 |
| 4,648,006 | 3/1987 | Rayburn | 361/309 |
| 4,754,366 | 6/1988 | Hernandez | 361/306 |
| 4,910,643 | 3/1990 | Williams | 361/414 |
| 4,954,929 | 9/1990 | Baran | 361/414 |
| 5,375,035 | 12/1994 | Stoddard | 361/306.2 |
| 5,459,642 | 10/1995 | Stoddard | 361/774 |
| 6,020,562 | * 2/2000 | Burns et al. | 174/261 |

OTHER PUBLICATIONS

Sisler, John, "Eliminating Capacitors From Multilayer PCBs," reprinted from Printed Circuit Design vol. 8, No. 7, Jul. 1991, 7 pages.
Ramo, Simon, et al., Fields and Waves in Communications Electronics, Second Edition, Copyright©1965, 1984 by John Wiley & Sons, Inc., pp. 79–81.
European Serach Report, The Hague, Jun. 14, 1994, 3 pages.
Decoupling Capacitor Placement, IBM Technical Disclosure Bulletin, Jan. 1977, U.S., vol. 19, No. 8, pages 3046–3047.
Patent Abstracts of Japan, vol. 16, No. 554 (E–1293) Nov. 25, 1992 & JP–A–04 211 191 (Hitachi Ltd.) Aug. 3, 1992.

* cited by examiner

Primary Examiner—Dean A. Reichard
Assistant Examiner—Hung V Ngo
(74) Attorney, Agent, or Firm—Akin, Gump, Strauss, Hauer & Feld, LLP

(57) ABSTRACT

A low inductance capacitor mounting structure for capacitors of multilayer printed circuit boards is provided. The capacitor mounting structure includes pads onto which a capacitor is mounted and vias or slots for connecting the solder pads to an upper conductor plane and a lower conductor plane. In the mounting structure, current is carried across the width of the solder pads so that a current in the solder pads flows directly underneath the current in the capacitor. This confinement of the magnetic filed which is between the capacitor and solder pads reduces the inductance of the associated magnetic path. The mounting structure also provides the lower conductor plane slightly below the upper conductor plane. The close spacing of the conductor planes confines a magnetic field, which is around the set of via or slot segments between the two conductor planes, so as to reduce inductance of the associated magnetic path. The close spacing also provides return paths between the lower conductor plane and the upper conductor plane with displacement current across spaces formed between the upper conductor plane and the lower conductor plane near the vias or slots between that two planes. These return paths substantially reduce inductance between the upper and lower conductor planes, thereby reducing the impedance of critical structures in the printed circuit board such as the power distribution structure of the printed circuit board. The reduced inductance of the capacitor mounting structure achieved by reducing the inductance of these regions improves the effectiveness of the associated capacitor, minimizes the undesirable retention of high-frequency noise by the associated printed circuit board, and allows for low impedance printed circuit boards.

42 Claims, 11 Drawing Sheets

LOW INDUCTANCE CAPACITOR MOUNTING STRUCTURE FOR CAPACITORS OF A PRINTED CIRCUIT BOARD

BACKGROUND OF THE INVENTION

1. Field of the Invention

This invention relates to capacitor mounting structures for capacitors of multilayer printed circuit boards, and more particularly to a low inductance capacitor mounting structure.

2. Description of the Related Art

As operating speeds and current densities increase for digital systems, noise has become an increasingly important concern. One source of high-frequency noise in digital systems is the parasitic inductance of a capacitor mounting structure for capacitors of printed circuit boards in such systems. One source of parasitic inductance has been the specific region bounded and defined by a bottom surface of a capacitor, a capacitor surface or solder pad, and vias of a capacitor mounting structure. This type of parasitic inductance is described in Stoddard, commonly-owned U.S. Pat. Nos. 5,375,035 and 5,459,642, of which Applicant in inventor. Other regions of a capacitor mounting structure, however, continue to provide parasitic inductance.

Certain of these regions are associated with the vias of a capacitor mounting structure. A via is an electrically conductive path through a substrate dielectric layer which connects solder pads to a power or ground conductor plane of a printed circuit board. When current is provided through the vias, the vias produce a magnetic filed forming a magnetic circuit around the vias. So far as is known, conventional efforts to reduce inductance of these regions have been unsuccessful. Such efforts have included either increasing the diameter of vias or providing a capacitor terminal for each via. Another approach to minimizing capacitor inductance has been to confine the magnetic field within a capacitor. This approach, however, has typically included providing vias outside the area where soldering occurs to avoid placing solder within a via. Traces between the capacitor body and the vias have provided a high inductance.

Further, another region providing parasitic inductance is associated with the capacitor body and the solder pads. The high inductance of certain regions of a capacitor mounting structure has inhibited capacitor response at high frequencies and caused retention of noise in printed circuit boards.

SUMMARY OF THE INVENTION

Briefly, the present invention provides a low inductance capacitor mounting structure for capacitors of multilayer printed circuit boards. The capacitor mounting structure includes pads onto which a capacitor is mounted and vias or slots for connecting the solder pads to an upper conductor plane and a lower conductor plane. In the mounting structure, current is carried across the width of the solder pads so that a current in the solder pads flows directly underneath the current in the capacitor. This confinement of the magnetic field which is between the capacitor and solder pads reduces the inductance of the associated magnetic path. The mounting structure also provides the lower conductor plane slightly below the upper conductor plane. The close spacing of the conductor planes confines a magnetic field, which is around the set of via segments between the two conductor planes, so as to reduce inductance of the associated magnetic path. The close spacing also provides return paths between the lower conductor plane and the upper conductor plane with displacement current across spaces formed between the upper conductor plane and the lower conductor plane near the vias or slots between the two planes. These return paths substantially reduce inductance between the upper and lower conductor planes, thereby reducing the impedance of critical structures in the printed circuit board such as the power distribution structure of the printed circuit board. The reduced inductance of the capacitor mounting structure achieved b reducing the inductance of these regions improves the effectiveness of the associated capacitor, minimizes the undesirable retention of high-frequency noise by the associated printed circuit board, and allows for a low impedance characteristic for printed circuit boards.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Conventional capacitor mounting structures have allowed for numerous regions of high inductance. These regions are defined by current-carrying conductors within a capacitor mounting structure. When current is passed through a conductor, the conductor produces a magnetic field around the conductor. The magnetic flux of the field may be viewed as the total number of field lines or lines of magnetic induction around the current-carrying conductor. Widely spaced magnetic flux liens result in low magnetic reluctance which allows for more magnetic energy and higher inductance. Conversely, if magnetic flux lines are confined or crowded, magnetic reluctance is increased, and energy in the magnetic filed and inductance are reduced.

The present invention solves the problem of undesirable regions of high inductance in a capacitor mounting structure through control of magnetic fields associated with these high inductive regions. In accordance with the present invention, this control is achieved through a variety of techniques for confining magnetic fields associated with a capacitor mounting structure. Operation of the present invention is pursuant to particular scientific principles relating to magnetic fields produced by current-carrying conductor. In particular, confining a magnetic field increases the reluctance of a magnetic field path defined by the magnetic field thereby reducing the inductance of the region associated with the magnetic field.

Figure 1:
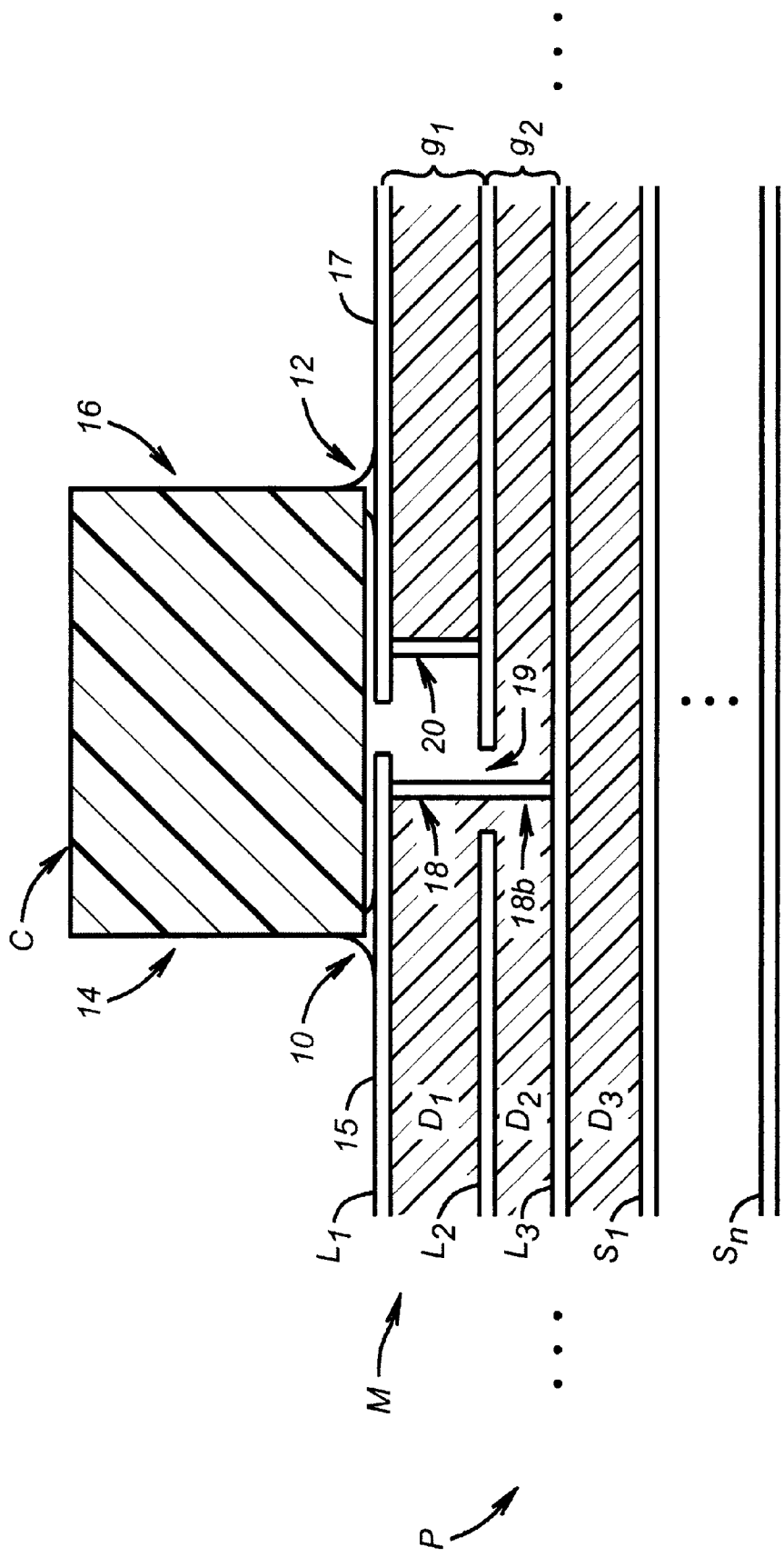
FIG. 1 is a cross-sectional view of a section of a low inductance printed circuit board of the present invention having a low inductance capacitor mounting structure of the present invention.

Turning now to the drawings, FIG. 1 shows a cross-sectional view of a section of a low inductance multilayer printed circuit board P of the present invention. The printed circuit board P section includes the low inductance capacitor mounting structure M of the present invention. The capacitor mounting structure M may of course be provided on other sections of a printed circuit board P where a capacitor C is surface mounted. The capacitor mounting structure M includes a capacitor surface pad or solder pad layer L1, an upper electrically conductive layer L2, and a lower electrically conductive layer L3. Each of these layers is made of a suitable conductive material which provides a continuous conductive path. The capacitor solder pad layer L1 provides a surface for mounting a capacitor C. The capacitor C may be mounted to the layer using solder fillets 10 and 12. The solder fillets 10 and 12 provide electrical connection between the capacitor solder pad layer L1 and the capacitor C. The capacitor solder pad layer L1 is preferably formed by two rectangular capacitor pads 15 and 17. One solder pad 15 or 17 serves as a positive capacitor terminal, and the other solder pad 15 or 17 serves as a negative capacitor terminal. It should be understood that the capacitor solder pad layer L1 may be formed by more than two solder pads and that the shape of a solder pad may be varied.

Figure 2B:
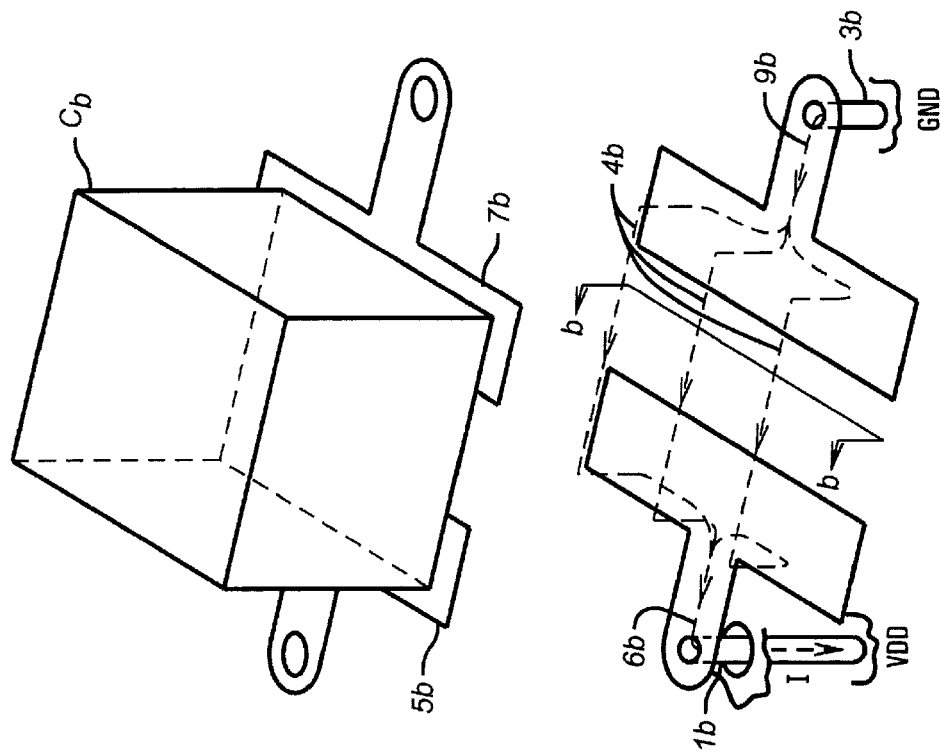
FIGS. 2A–2B are isometric views of exemplary conventional capacitor mounting structures and the current paths through solder pads and a capacitor of the structures.
Figure 2A:
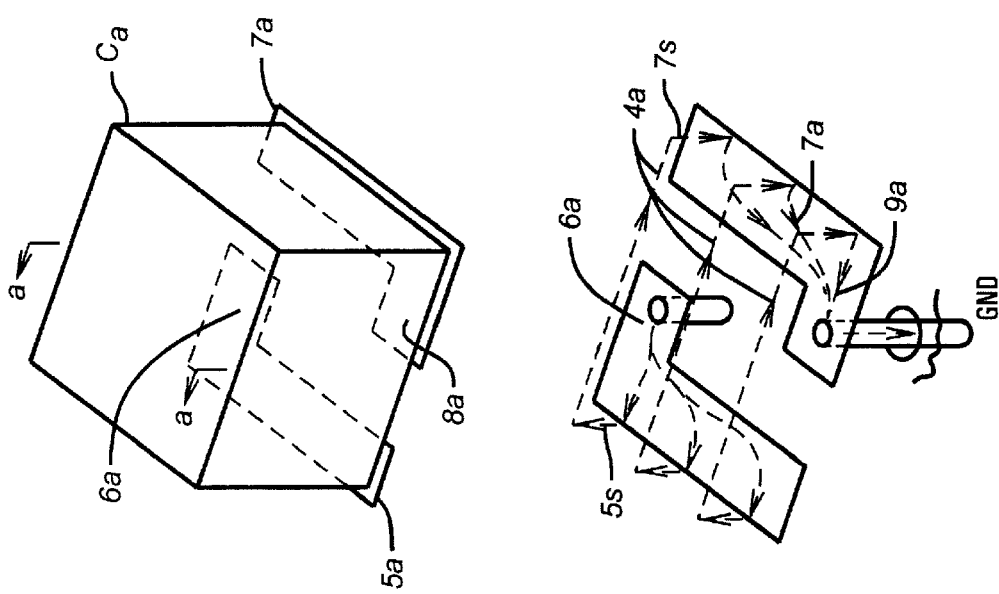
Figure 3B:
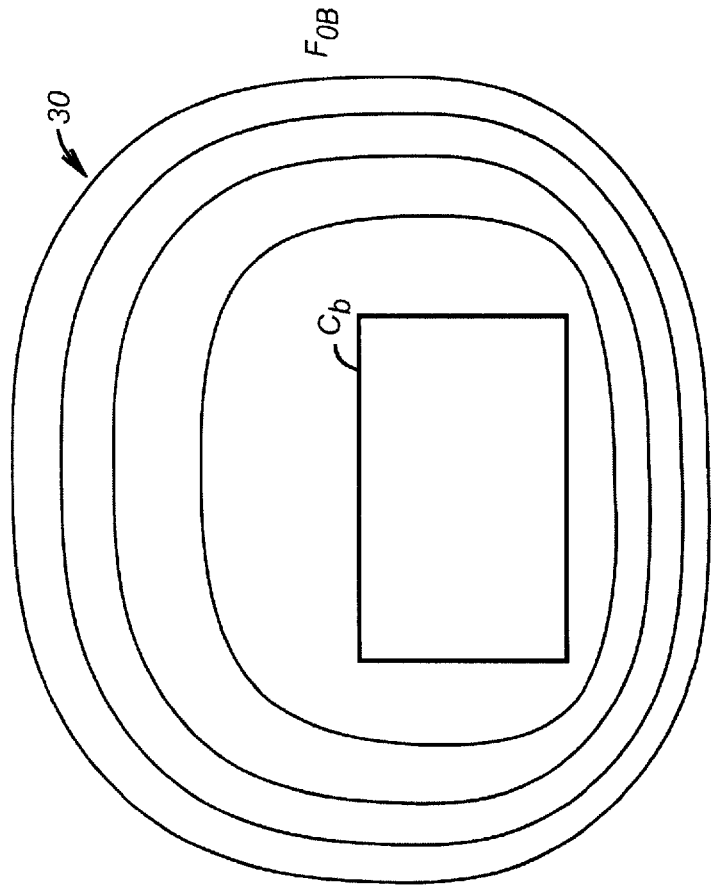
FIG. 3B is a cross-sectional view across plane 2–2b of the unconfined magnetic field associated with the conventional mounting structure of FIG. 2B.
Figure 3A:
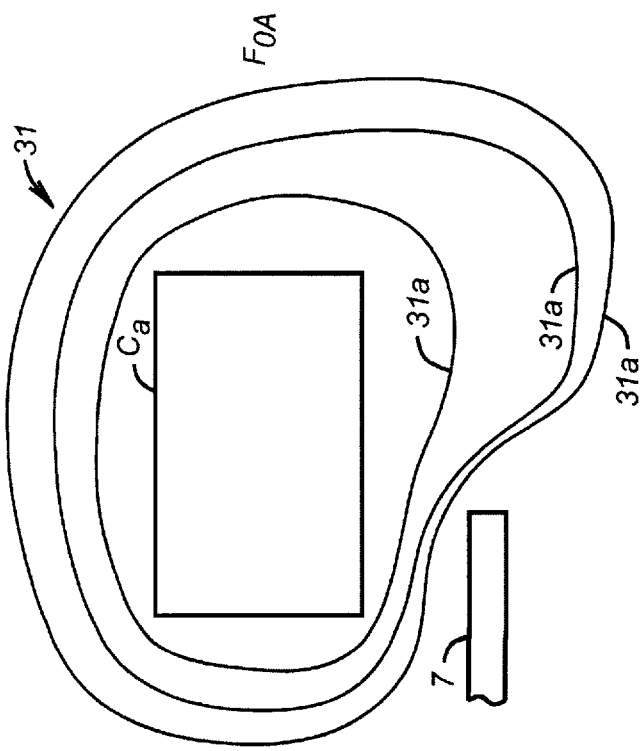
FIG. 3A is a cross-sectional view across plane 2–2a of the unconfined magnetic filed associated with the conventional capacitor mounting structure of FIG. 2A.

Referring to FIGS. 2A–2B, two examples of conventional capacitor mounting structures and associated current paths through solder pads 5 and 7 and a capacitor $C_a$ are shown. Referring to FIG. 2A, in the conventional capacitor mounting structure, current 5s and 7s entering and exiting a capacitor $C_a$ is conducted along the outer edges of pads 5a and 7a. This approach results in a remote current path 4a in a plane of the capacitor $C_a$ parallel to the bottom surface of the capacitor $C_a$. A current path is remote when the current path lacks an adjacent and parallel current path of opposite direction. Though a portion of the current path 9a in the solder pads 5a and 7a is parallel to the current path 4a in the horizontal plane of the capacitor $C_a$, that portion is not aligned directly below the capacitor current path 4a. Also, since a portion of the current path 9a in the solder pads 5a and 7a is along narrow fingers 6a and 8a, the current path 4a in the capacitor $C_a$ has a wider path than the current path 9a in the solder pads 5a and 7a. As such, the two remote current paths 4a and 9a allow for an unconfined magnetic filed $F_0$ as shown in FIG. 3A.

As a result of the current path 4a in the capacitor $C_a$ and the current path 9a in the solder pads 5a and 7a being remote, an unconfined magnetic field $F_{OA}$ (FIG. 3A) is produced below the capacitor $C_a$. The magnetic field path is confined only to the region directly between capacitor $C_a$ and solder pad fingers 6a and 8a. The magnetic field paths 31a below the solder pad 7a represent the unconfined portion of the magnetic field path 31. It should be understood that the illustrated magnetic field path is exemplary. If the cross-sectional view were taken across a plane intersecting finger 6a, the unconfined portion of the resulting magnetic field path would be the magnetic field path below solder pad layer 5a. Thus, the magnetic filed paths below both solder pad layers 5a and 7a represent unconfined portions of the magnetic field produced by the conventional capacitor mounting structure of FIG. 2A. The unconfined magnetic field is also a result of the current path 9 in the solder pads 5a and 7a having a narrower path than the current path 4 in the capacitor $C_a$ (FIG. 2). The unconfined magnetic field is represented by magnetic lines 31 having a low length to width (L/Cw) ratio. L corresponds to width of the capacitor $C_a$, and Cw corresponds to the distance between the capacitor body $C_a$ and the solder pads 5a and 7a. The low length to width ratio indicates a low reluctance $R_0$ fo the magnetic circuit path represented by field lines 31.

Referring to FIG. 2B, current I is conducted out of the ground via 3b, across the outward finger 8b of the pad 7b, up into the capacitor $C_b$, across the width of the capacitor $C_b$, down to the pad 5b, across the outward finger 6b, of the pad 7b, and into the power via 1b. The current path 9b in the pads 5b and 7b are not below the current path 4b in the capacitor $C_b$. This approach also results in a remote current path 4b in a plane of the capacitor $C_b$ parallel to the bottom surface of the capacitor $C_b$. The remote current path 4b allows for an unconfined magnetic field $F_{OB}$ as shown in FIG. 3B. Referring to FIG. 3B, the unconfined magnetic field $F_{OB}$ is more unconfined than the magnetic field shown in FIG. 3A as the current path 4b lacks an adjacent current path for any portion of the length of the capacitor $C_b$.

Figure 4:
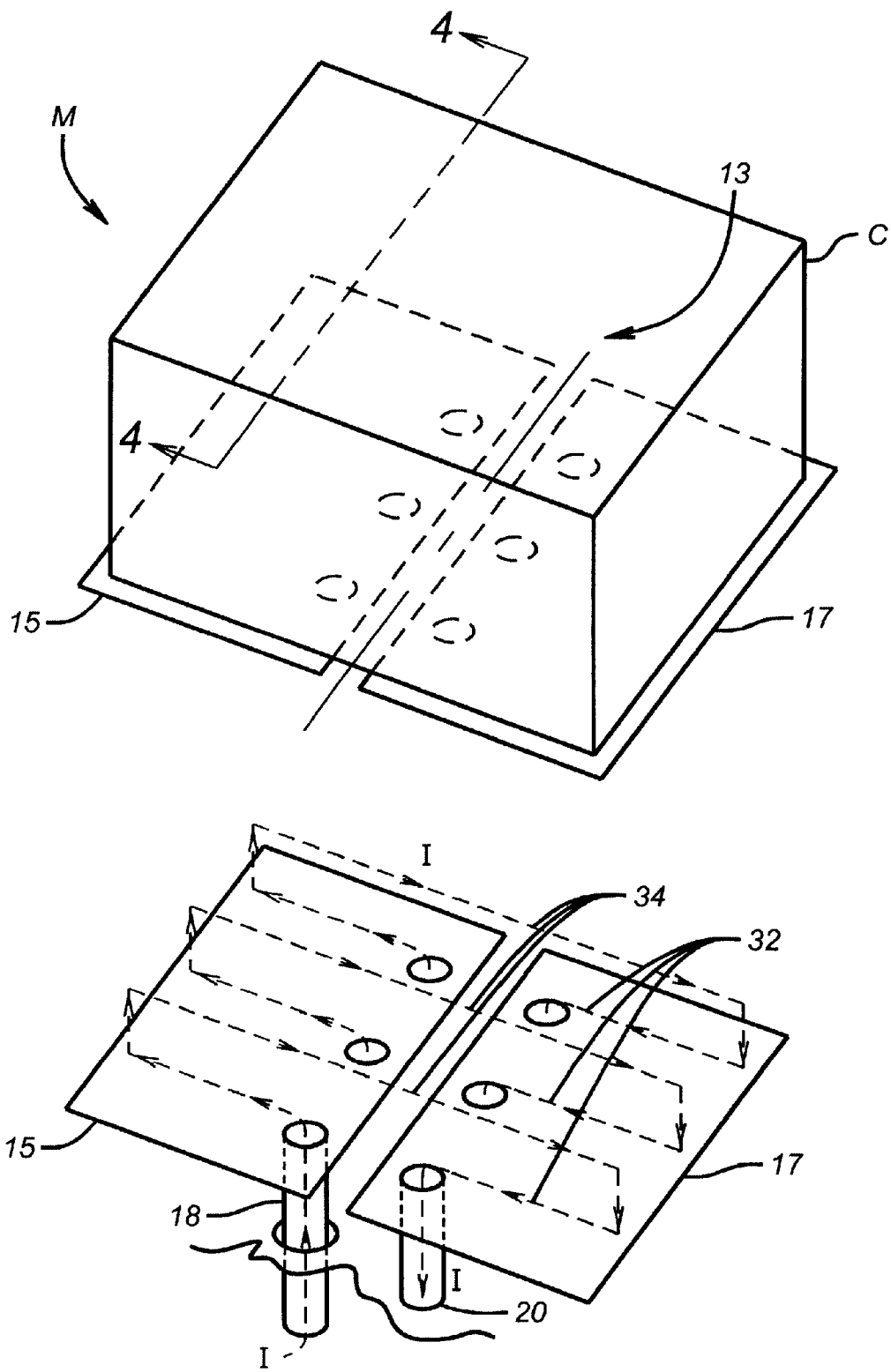
FIG. 4 is an isometric view of the capacitor mounting structure of FIG. 1 and the current path through the solder pads and capacitor of the structure.

Referring to FIG. 4, the capacitor mounting structure M of the present invention is shown. The capacitor mounting structure M eliminates high inductance by providing a current path 32 across the width of the solder pads 15 and 17 complementary to the current path 34 in the horizontal plane of the capacitor C. The current path 32 in the surface pads 15 and 17 having a width comparable to the width of the current path 34 in the capacitor C suitably complements the current path 34 in the capacitor C. Due to the width of the current path 32, current I in the solder pads 15 and 17 is not restricted to narrow fingers as in the prior art (FIGS. 2A–2B). Providing vias close to a center axis of the capacitor C schematically represented by a center line 13 also allows for improved width of the current path 32 in the solder pads 15 and 17. By providing vias close to the center axis 13, the current path 32 spans the full width of the solder pads 15 and 17 maximizing the portion of the current path 34 in the capacitor C which the current path 32 in the solder pads 15 and 17 is below. Preferably, the current path 32 in the solder pads 15 and 17 is directly below the current path 34 in the capacitor C.

Figure 5:
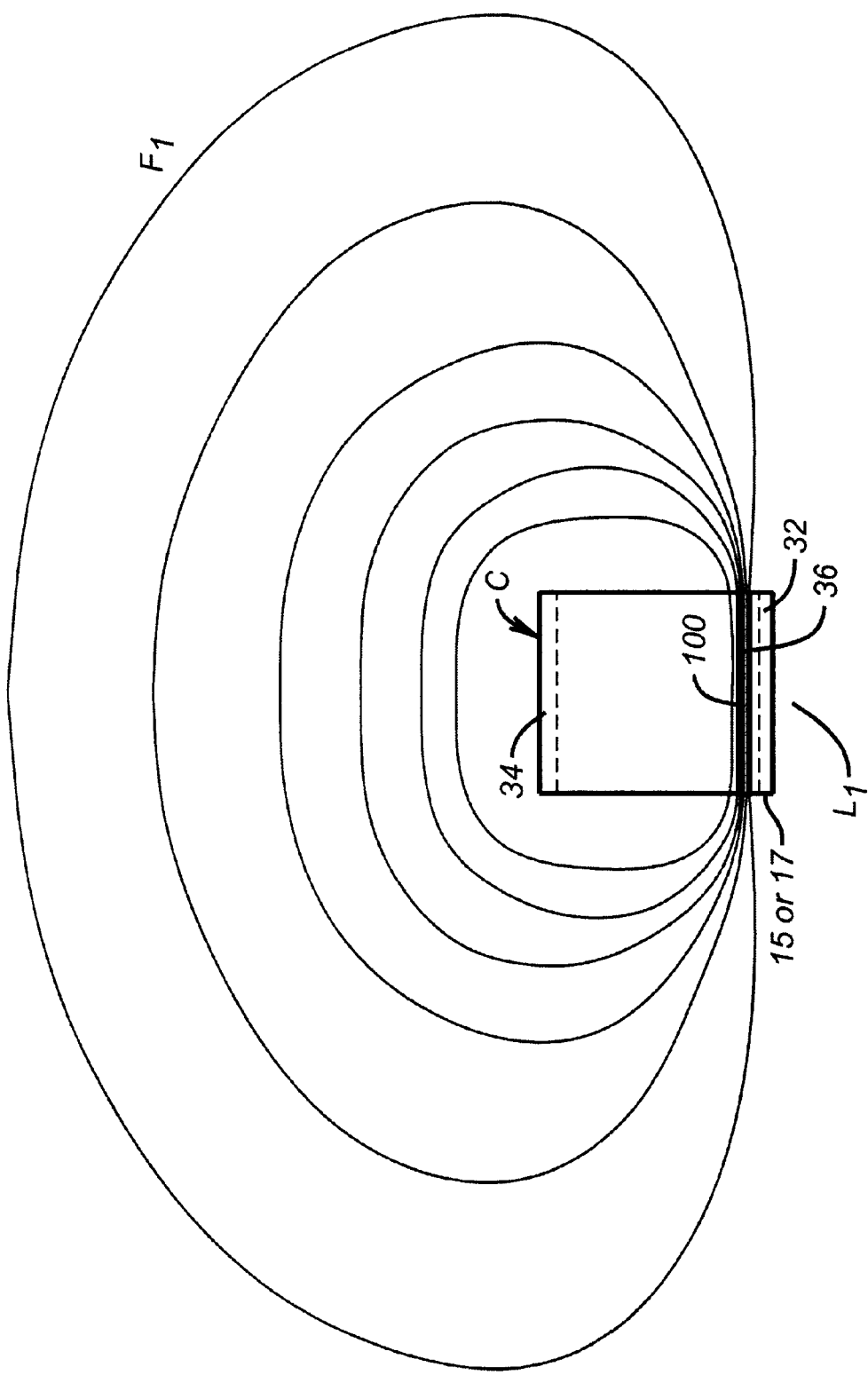
FIG. 5 is a cross-sectional view across plane 4—4 of a magnetic field confined between a capacitor and the associated solder pads of FIG. 4 in accordance with the present invention.

Referring to FIG. 5, the magnetic field $F_1$ resulting from the current paths of FIG. 4 is shown. The magnetic field $F_1$ must pass between the current path 34 in the capacitor C and the current path 32 in the solder pads 15 and 17 causing the current I to flow essentially across the full width of the capacitor pads 15 and 17. In particular, the magnetic field $F_1$ passes between the solder pads 15 and 17 and a bottom surface 100 of the capacitor C. Providing current flow essentially across the full width of the capacitor pads 15 and 17 confines the magnetic field $F_1$ into a limited vertical space over a significant length of the capacitor C. This confined filed $F_1$ has a higher reluctance than the magnetic field $F_{OA}$ and $F_{OB}$ of FIGS. 3A–3B. The increased reluctance $R_1$ results in a reduced inductance $L_1$. For example, above the capacitor C where the magnetic field $F_1$ is unconfined, a length to width ratio of about 5:1 might be typical. Below the capacitor C where the magnetic field $F_1$ is confined (FIG. 5), as represented by parallel filed lines 36, a length to width ration of about 30:1 can be achieved. Thus, producing the magnetic field $F_1$ in accordance with the present invention may increase reluctance $R_0$ and decrease inductance $L_0$ by about a factor of six.

The capacitor C is separated form the solder pads 15 and 17 by the thickness of the solder which may be within about 3 mils. In accordance with the present invention, further reducing the spacing between the capacitor C and the solder pads 15 and 17 has the effect of increasing the reluctance of the magnetic field path $F_1$. In principle, if the spacing between the capacitor C and solder pads 15 and 17 were reduced to zero, there would be no magnetic field, except perhaps eddy fields. In accordance with the present invention, a relationship between the amount of spacing between a capacitor and a solder pad and inductance of an associated magnetic field path has been found. If the amount of spacing is about 30 mils, there is only a small reduction effect upon inductance of the region between the capacitor and solder pad. If the amount of spacing is about 10 mils, the inductance of the region is further reduced to a significantly low inductance. If the amount of spacing is about 3 mils or less, the inductance of the region is further reduced beyond the inductance obtained by a spacing of 10 mils to achieve a very low inductance.

Returning to FIG. 1, the upper electrically conductive layer L2 and the lower conductive layer L3 serve as voltage planes for the printed circuit board P. One layer serves as the power conductor plane while the other layer serves as the ground conductor plane. The upper electrically conductive layer L2 is electrically connected to the solder pad layer L1 through a set of vias or feedthroughs 20 formed in a substrate dielectric layer $D_1$. The dielectric layer $D_1$ electrically isolates the solder pad layer L1 form the upper electrically conductive surface layer L2 and the vias 20 constitute the only electrical connection between the layers. The vias 20, which are plated with a suitably conductive material such as copper, carry signals between the two layers. The vias 20 may be formed by drilling, laser blasting, or other suitable methods. Laser blasting, however, has allowed for more precise formation. The distance $g_1$ (FIGS. 1, 6 and 8) between the solder pad layer L1 and the upper electrically conductive layer L2 is typically on the order of 4.5 mils.

The other set of vias 18 provides electrical connection between the solder pad layer L1 and the lower electrically conductive layer L3. The vias 18, which preferably are aligned with one another, are formed through both a substrate dielectric layer $D_2$ and the substrate dielectric layer $D_1$. The vias 18 bypass the upper electrically conductive layer L2 by means of clearance hole 19 which provide electrical isolation between the upper electrically conductive layer L2 and the vias 18. In a conventional printed circuit board, the lower electrically conductive layer L3 is spaced a significant distance from the upper electrically conductive layer L2 such that the lower electrically conductive layer L3 is buried several layers down in a printed circuit board. For example, the typical distance $g_2$ between the upper electrically conductive layer L2 and the lower electrically conductive layer L3 is on the order of 15–20 mils. One concern with providing a lower electrically conductive layer L3 close to an upper electrically conductive layer L2 has been subjecting a conductive layer to local contaminants internal to the adjacent conductive layer. To isolate the local contamination of an adjacent conductive layer, a minimum spacing, which is a function of the voltages applied to the layers, was maintained between the upper electrically conductive layer L2 and the lower electrically conductive layer L3. In the present invention, however, conductive layers of the printed circuit board P are cured through a suitable polymer bonding process to minimize local contamination. Various techniques for curing conductive layers of a printed circuit board are known.

Yet another reason that the lower electrically conductive layer L3 has typically been provided at a significant spacing or distance below the upper electrically conductive layer L2 is so that a plurality of signal or trace layers $S_1$-$S_n$ may be provided between the upper electrically conductive layer L2 and the lower electrically conductive layer L3. In the present invention, however, signal layers $S_1$-$S_n$ are provided below the lower electrically conductive layer L3 with the signal layers $S_1$-$S_n$ and the lower electrically conductive layer L3 separated by a substrate dielectric layer $D_3$. In this way, the typical spacing between the lower electrically conductive layer L3 and the upper electrically conductive layer L2 may be significantly reduced. For example, in the present invention, the distance $g_2$ between the upper electrically conductive layer L2 and the lower electrically conductive layer L3 may be on the order of 2–3 mils. The distance $g_2$ between the upper electrically conductive layer L2 and the lower electrically conductive layer L3 may also be less than 10 mils and even less than 5 mils. The lower electrically conductive layer L3 is provided as close to the upper electrically conductive layer L2 as can be accomplished without shorting the two layers Thus, it should be understood that the spacing $g_2$ between an upper electrically conductive layer L2 and a lower electrically conductive layer L3 may be substantially less than 15 mils.

Figure 6:
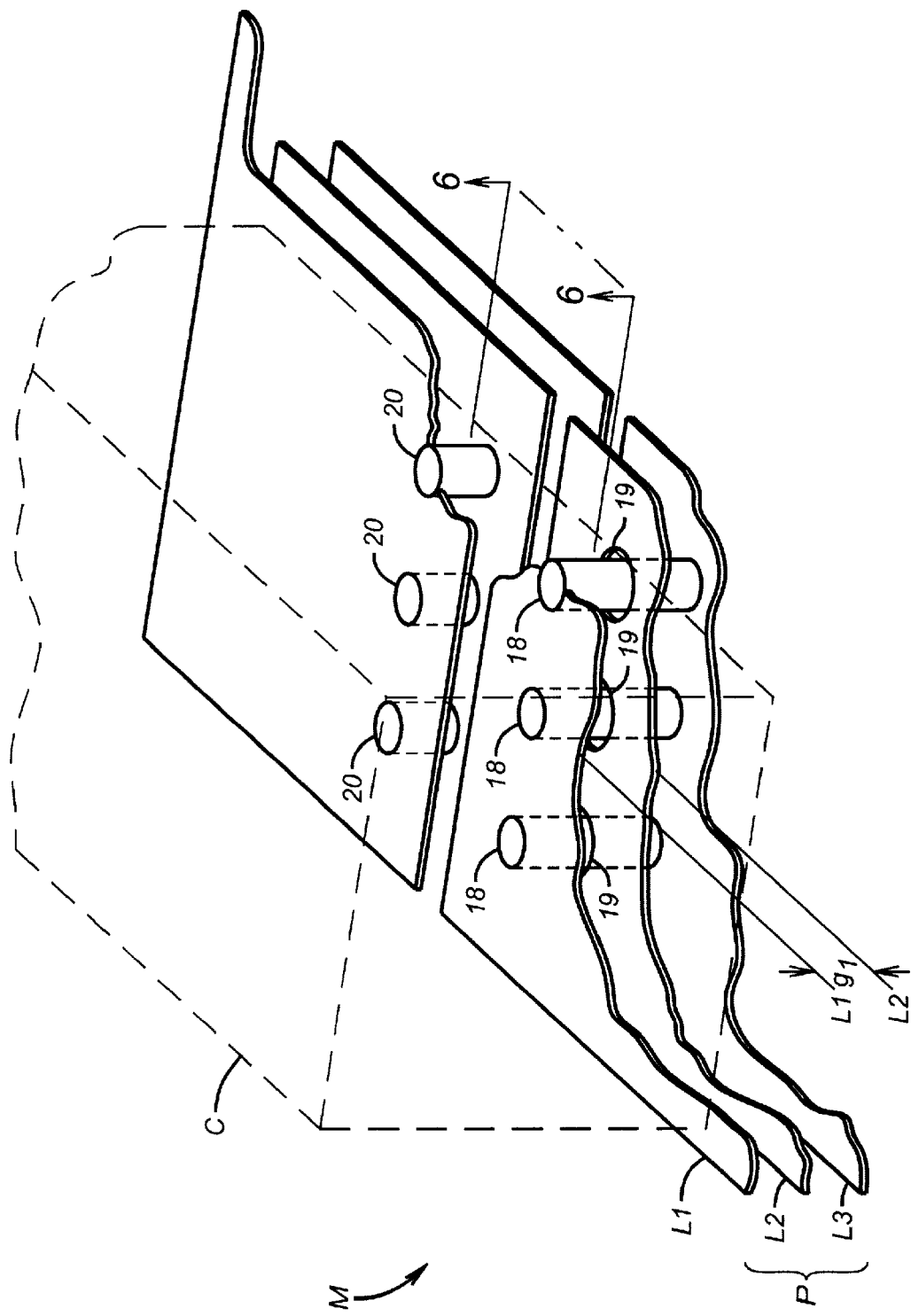
FIG. 6 is an isometric view of the solder pad layer, upper electrically conductive layer, lower electrically conductive layer, and associated vias of FIG. 1 with portions broken away.
Figure 7:
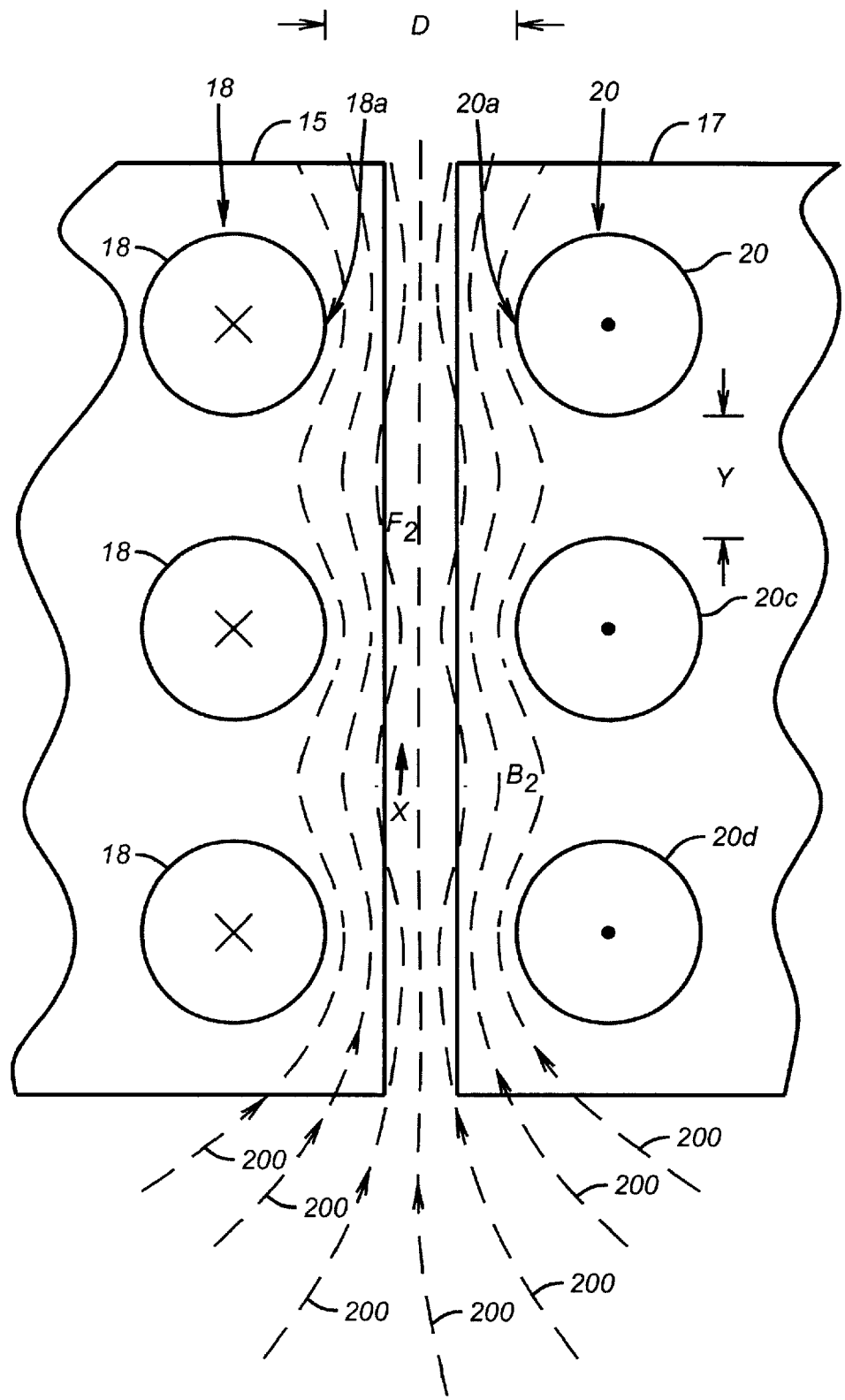
FIG. 7 is a cross-sectional view across plane 6—6 of the magnetic field associated with the solder pad layer and the upper electronically conductive layer of FIG. 6.

Turning to FIG. 6, the printed circuit board P is isometrically shown with portions broken away to further indicate the vias 18 and 20 of the capacitor mounting structure M. The magnetic field line associated with vias 18 and 20 between the L1 conductor plane and the L2 conductor plane are illustrated in FIG. 7. In accordance with convention, an encircle dot (or head of an arrow) represents current I coming out of the L1 conductor plane, and an encircled X (or tail of an arrow) represents a current I going into the L1 conductor plane. The vias 18 are shown as a set of three vias, and the vias 20, 20ac 20ad are also shown as a set of three vias. In a conventional capacitor mounting structure, four or less total vias are typically provided. In accordance with the present invention, it has been found that the magnetic field path formed by this low number of vias contributes to via inductance $L_2$.

In the capacitor mounting structure M of the present invention, however, at least six total vias are preferably used. Discrete vias, however, may be replaced by parallel slots with one slot in each capacitor solder pad. Using a significant number of vias or a pair of slots lengthens the magnetic field path X between vias 18 and vias 20, 20c and 20d. The spacing Y between the vias aligned on the same solder pad also defines the length of the magnetic field path X for the capacitor mounting structure M. In the present invention, adjacent and aligned vias may be spaced about 13 mils apart. Vias 20c and 20d are examples of vias which are adjacent and aligned vias may be aligned. With an addition of vias or an increase of the spacing between vias on the same solder pad, reluctance R of the magnetic circuit path 200 of the magnetic field $F_2$ increases. As the reluctance R of the magnetic circuit path 200 increases, via inductance $L_2$ decreases. Thus, an increased reluctance $R_2$ and reduced inductance $L_2$ is achieved by providing a generally long magnetic field path X.

In addition, the spacing D between vias on one solder pad carrying current I in one direction and the corresponding vias on another solder pad carrying current I in the opposite direction affects via inductance $L_2$. The spacing D between the inner edges 18a and 20a of the sets of vias 18 and 20 may be less than 24 mils. For example, it has been determined that a spacing of 15 mils may be achieved. With improved methods, dimension D may be further reduced which would further reduce inductance. Placing the tow sets of vias 18 and 20 close together near the edge of the solder pads 15 and 17 narrows the magnetic circuit path 200 between the sets of vias 18 and 20. For example as the spacing D between corresponding via edges 18a and 20a decreases, an increased reluctance $R_3$ of the magnetic circuit path 200 and a reduced via inductance $L_3$ is achieved.

Figure 8:
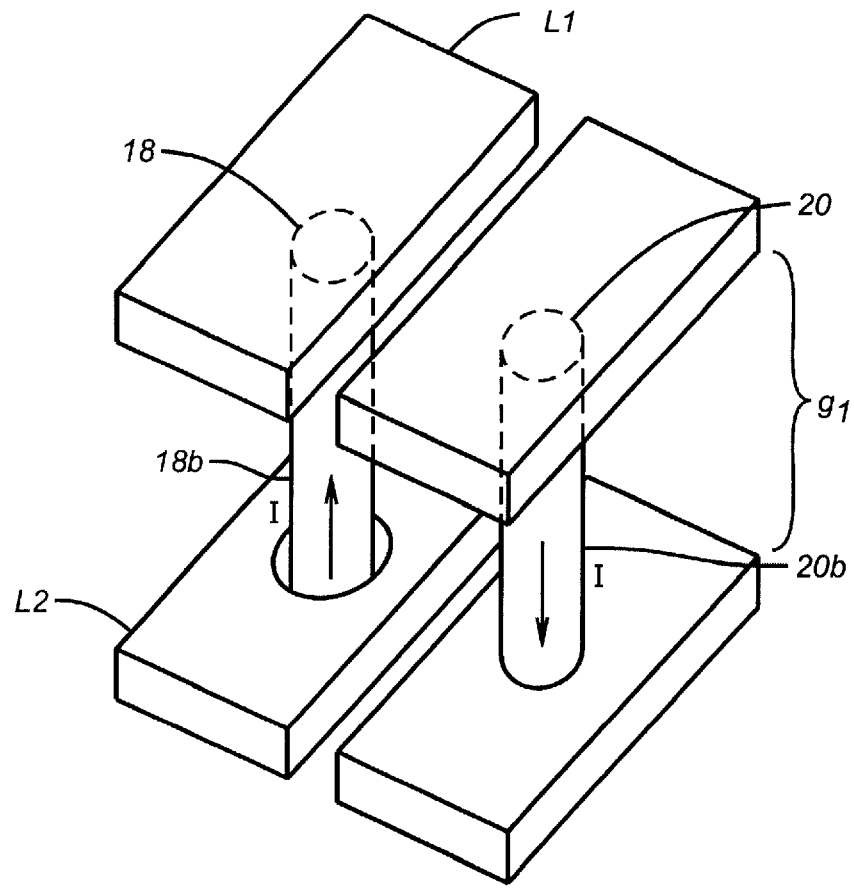
FIG. 8 is an isometric view of the solder pad layer, upper electrically conductive layer, and associated vias of FIG. 1 with the associated substrate dielectric layer removed.

Referring to FIG. 8, segments 18b and 20b of the pair of vias 18 and 20 between the solder pad layer L1 and the upper electrically conductive layer L2 are shown wit the substrate dielectric layer $D_1$ removed. For exemplary purposes, one set of vias 18 is providing a current I to the capacitor C, and the other set of vias 20 is providing current I from the capacitor C. Since each via in the sets of vias 18 and 20 constitutes an electrical path carrying current I, magnetic field $F_3$ and $F_4$ (FIG. 9) are produced with respect to both sets of vias 18 and 20.

Figure 9:
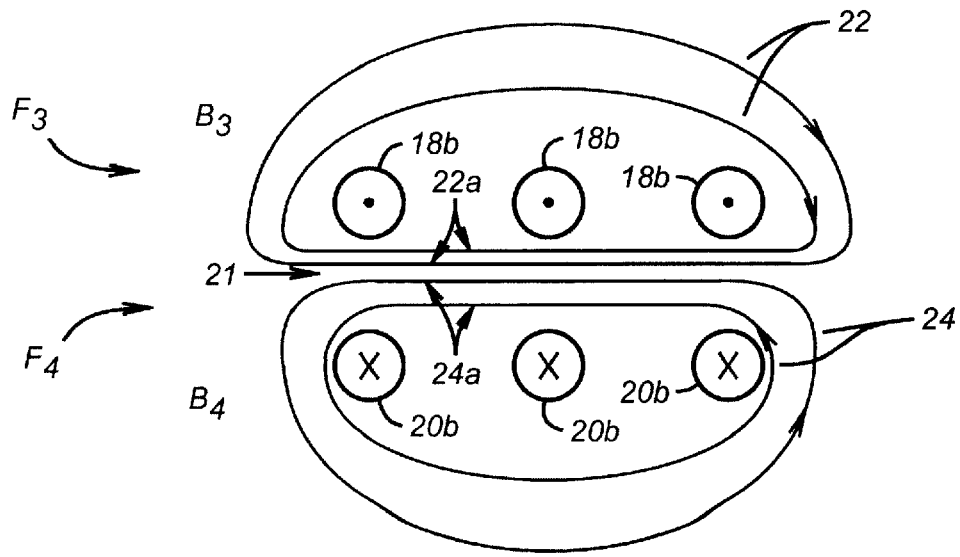
FIG. 9 is a schematic illustration of the magnetic fields between the layers and vias of FIG. 6.

Turning to FIG. 9, an illustration of the magnetic fields $F_3$ and $F_4$ for segments 18b and 20b of vias 18 and 20 are shown. Although each set of vias is shown including three vias, it should be understood that a set of vis may include any suitable larger number of vias or a continuous slot may be used instead of individual vias. $F_3$ corresponds to the magnetic field for via segments 18b, and $F_4$ corresponds to the magnetic field for via segments 20b. It should be understood that slots and slot segments may be used in the place of vias and via segments. Field lines 22 represent the magnetic flux $B_3$ of the $F_3$ magnetic filed, and filed lines 24 represent the magnetic flux $B_4$ of the $F_4$ magnetic field. The arrow for each field line represents the direction of the magnetic flux. In accordance with the "right hand rule" which is well known in the art, the magnetic flux 22 produced by exemplary via segments 18b having current I coming out of the L1 conductor plane travels in a clockwise direction around the horizontal axis defined by the via segments 18b. Since exemplary via segments 20b include current I going into the L1 conductor plane for the illustrated example, the magnetic flux 24 travels in a counterclockwise direction around the horizontal axis defined by the via segments 20b. Both magnetic fields $F_3$ and $F_4$ thus are closed loops concentric about their associated via segments.

The magnetic fields $F_3$ and $F_4$ are bounded or constrained between via segments 18b and 20b. Between the via segments 18b and 20b, the magnetic fields $F_3$ and $F_4$ are confined within a narrow strait 21. The parallel magnetic field lines 22a and 24a within the strait 21 provide a high reluctance due to the confined area fo the strait 21. Since inductance L is inversely proportional to reluctance R, the high reluctance $R_4$ results in a low via inductance $L_4$. This structure reduces via inductance L well below conventional capacitor structure designs. However, as total inductance of the capacitor mounting structure is reduced, the inductance of each segment becomes increasingly significant. It is therefore anticipated that process improvements will be used to reduce via inductance with slots, laser drilling, closer spacing and other refinements.

Figure 10A:
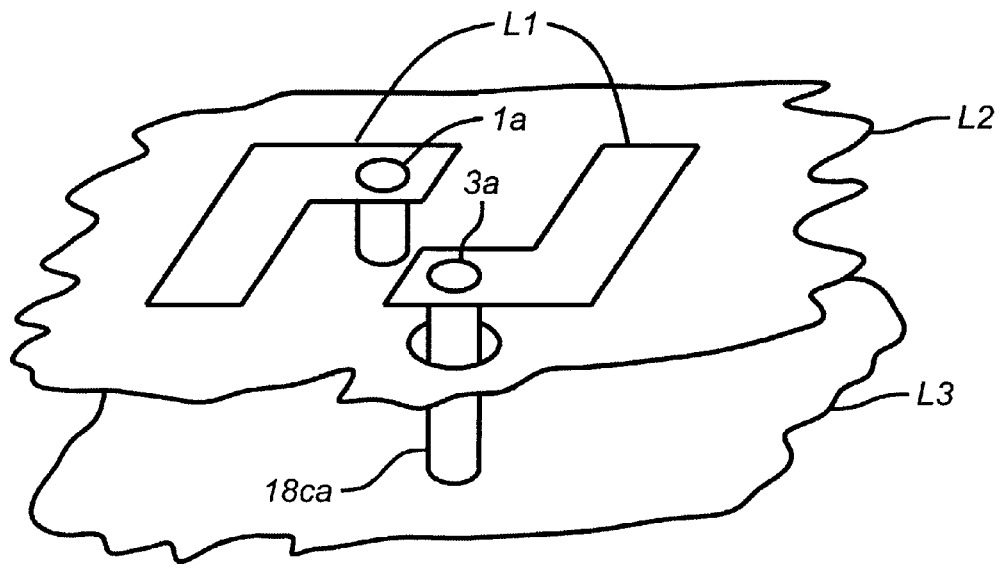
FIGS. 10A–10B are schematic vies of the upper electrically conductive layer, lower electrically conductive layer, and associated vias of FIG. 2 with the associated substrate dielectric layer removed in accordance with a conventional capacitor mounting structure.
Figure 10B:
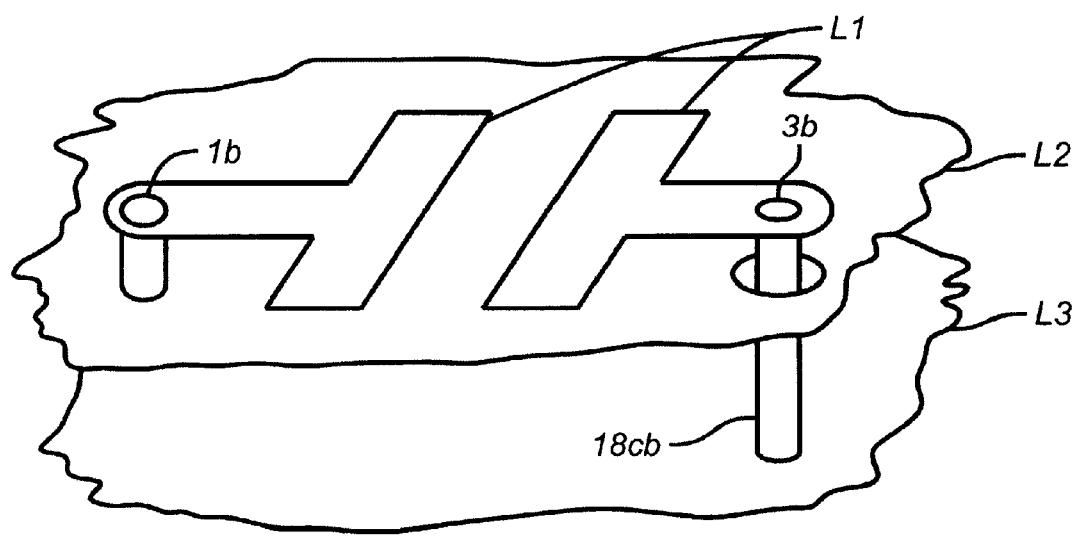

Referring to FIGS. 10A–10B, the via segments 18ca and 18cb between the upper electrically conductive layer L2 and the lower electrically conductive layer L3 generate an unconstrained magnetic fields $F_{5A1}$, $F_{5A2}$, and $F_{5B}$ of a certain magnitude. Unlike the via segments 18b and 20b between the L1 conductor plane and the L2 conductor plane, the via segments 18ca and 18cb between the L2 conductor plane and L3 conductor plane lack adjacent and parallel vias which carry current I in the opposite direction. The low reluctance of the unconstrained magnetic field $F_{5A1}$, $F_{5A2}$, and $F_{5B}$ derived from these remote via segments 18ca and 18cb gives capacitor mounting structures of FIGS. 10A and 10B a high inductance characteristic.

Figure 11A:
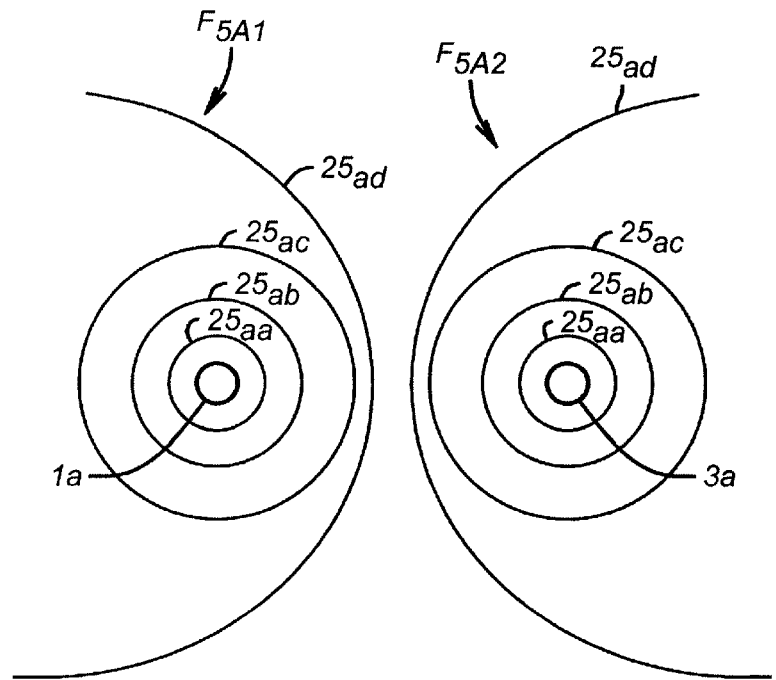
FIGS. 11A–11B are illustrations of the magnetic fields associated with the layers and vias of FIGS. 10A–10B.
Figure 11B:
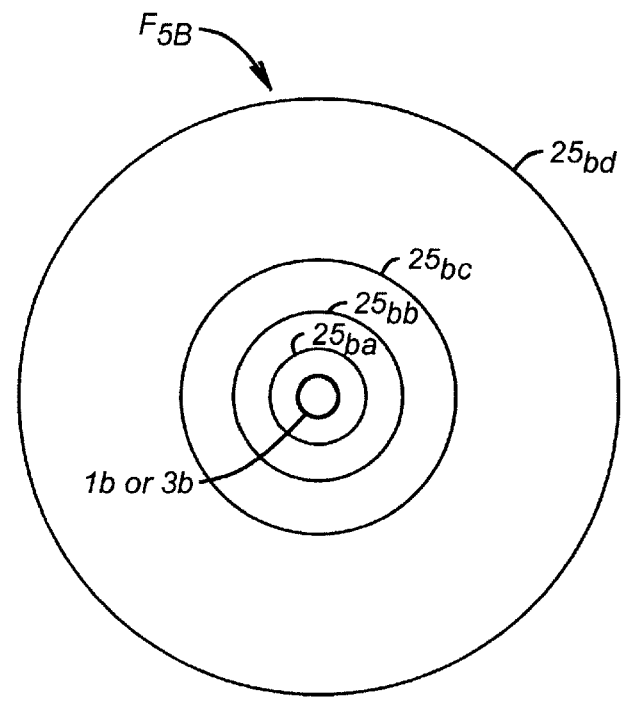
Figure 12:
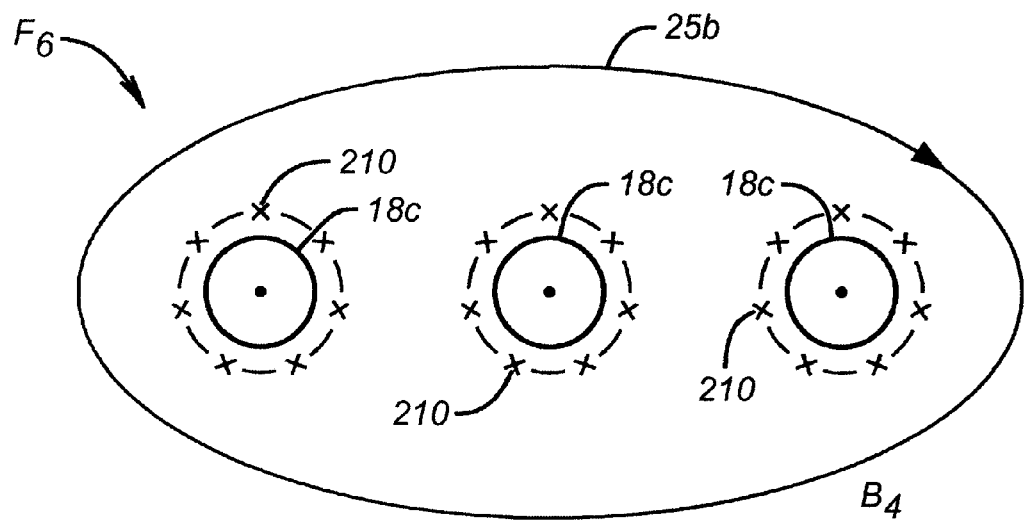
FIG. 12 is an illustration of the magnetic field associated with the upper electrically conductive layer, lower electrically conductive layer, and associated vias of FIG. 6 in accordance with the low capacitor mounting structure of FIG. 1.

Referring to FIGS. 11A–11B, magnetic fields for the conventional capacitor structures of FIGS. 10A and 10B are shown. Referring to FIG. 11A, the magnetic field $F_{5A1}$ is the magnetic field for one via 1a or 3a, and magnetic field $F_{5A2}$ is the magnetic field for the other via 3a or 1a. Since the vias 1a and 3a are close together, the magnetic fields $F_{5A1}$ and $F_{5A2}$ affect one another. Referring to FIG. 11B, the magnetic field $F_{5B}$ represents the magnetic field around via 1B and also the magnetic filed around via 3b. Vias 1b and 3b are remote vias and therefore do not affect one another. The magnetic fields $F_{5A1}$, $F_{5A2}$, and $F_{5B}$ generated b conventional capacitor mounting structures have a low reluctance resulting in a region of high inductance associated with these magnetic fields. The low reluctance is represented by the high number of magnetic field lines 25aa-25bd compared to the magnetic field line 25 b associated with magnetic field $F_6$. FIG. 12 shows the currents associated with via 18c between the layers L2 and L3 in accordance with the present invention. In contrast to magnetic fields $F_{5A1}$, $F_{5A2}$, and $F_{5B}$, the magnetic field $F_6$ generated by providing the lower electrically conductive layer L3 closely below the upper electrically conductive layer L2 in accordance with the present invention has a high reluctance resulting in a low via inductance region associated with magnetic field $F_6$. The total inductance L of the capacitor mounting structure M between the upper and lower electrically conductive layers L2 and L3 may be on the order of 0.5 nH. The via inductance L of the capacitor mounting structure M between the upper and lower electrically conductive layers L2 and L3 may be less than 0.1 nH.

Figure 13:
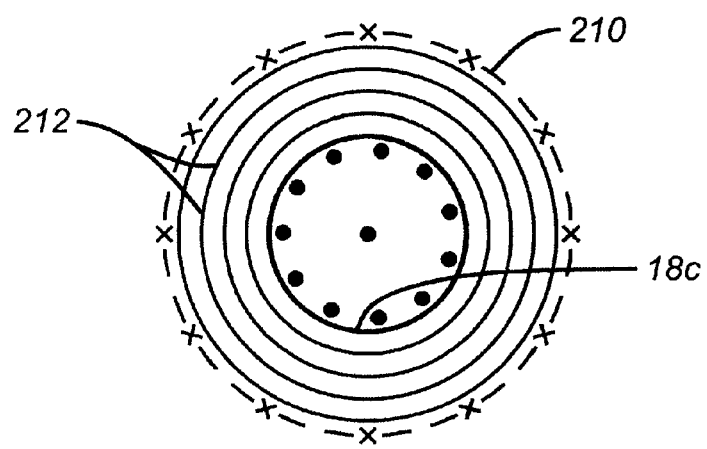
FIG. 13 is an enlarged illustration of a confined magnetic field of FIG 12.

Referring to FIG. 13, when the lower electrically conductive layer L3 is provided in close proximity below the upper electrically conductive layer L2 and voltages are present on both planes, any voltage between the planes creates a "displacement current." Displacement current is current resulting from the displacement fo charge rather than actual flow of current I. Because of the close spacing $g_2$ between the tow planes L2 and L3, additional return paths are provided allowing more movement of charges form one plane to another with less applied voltage. The displacement current between the planes L2 and L3 appears as if it were conducted from the edge of the L2 plane next to the via clearance hole 19 to the L3 plane below. This current path is a column 210 surrounding the via 18c. The magnetic field 212 is confined between the via 18c and the displacement current column 210 which establishes a high reluctance and a magnetic field path of low inductance (FIG. 13).

In a conventional capacitor mounting structure, current is provided and returned by vias within the same set. That is, if a current I is provided to the lower electrically conductor layer L3 by a via 8, then the current I is returned through a via 18. In the present invention, however, the close proximity of the upper electrically conductive layer L2 and the lower electrically conductive layer L3 allows for displacement current to provide additional return paths. For example, a current I provided from solder layer L1 to the upper electrically conductive layer L2 through via 20 is able to return through the lower electrically conductive layer L3 and via 18. The voltage difference between the lower and upper electrically conductive layers L3 and L2 allows for displacement current $i_2$ across the gap or space between nodes 206 and 208 and displacement current $i_1$ across nodes 202 and 204. Flow of the displacement current across the gap or space between node 202 and node 204 is indicated schematically as $i_1$. Flow of displacement current across the gap between node 208 to node 206 is indicated schematically as $i_2$. Thus, additional return paths for current in the lower electrically conductive layer L3 or the upper electrically conductive layer L2 are defined. Overall current flow into via 18 is illustrated by broken line arrows.

New return paths in accordance with the present invention allow for a signal provided between the layers or planes to travel nearly instantaneously. That is, the time for a signal to travel between the two layers is found to be less than 300 picoseconds. In such a period of time, charge has not yet been distributed on the destination plane, Therefore, as a result of this short transmission time for a charge to travel for a source layer to a destination layer, any charge between lower electrically conductive layer L3 and the upper electrically conductive layer L2 encounters a low impedance characteristic for the destination electrically conductive layer. This low impedance characteristic is a result of very small amounts of energy being stored in the highly confined magnetic field $F_6$ (FIG. 12). In particular, the minimized inductive effects and rapid current changes produce minimum inductive voltage drops (L di/dt). the dynamic impedance of the destination layer and source layer is on the order of 50 milliohms. Thus, the magnetic field $F_6$ (FIG. 12) achieve b defining additional current return paths is of a significantly lower magnitude than a magnetic field $F_{5A1}$, $F_{5A2}$, and $F_{5B}$ (FIG. 11) generated by conventional capacitor mounting structures. This reduced magnitude of a magnetic field results in a substantially reduced inductance characteristic for the capacitor mounting structure M.

By substantially reducing the inductive component between the upper and lower electrically conductive layers L2 and L3, the capacitor mounting structure M of the present invention generates a low impedance characteristic for the printed circuit board P. The low impedance characteristic of the printed circuit board P is due to the reduced impedance of critical structure in the printed circuit board P such as the impedance of the power distribution structure of the board P. This low impedance characteristic of the printed circuit board P reduces the likelihood of electromagnetic or radio frequency interference with operation of the printed circuit board P. For example, when two devices of a printed circuit board P are coupled to a power plane, it is believed that an intermodulation noise product of the frequencies of the devices is generated. By reducing the impedance characteristic of the printed circuit board P, it is believed these intermodulation noise products may be substantially suppressed.

The foregoing disclosure and description of the invention are illustrative and explanatory thereof, and various changes in the size, shape, materials, components, circuit elements, wiring connections and contact, as well as in the details of the illustrated circuitry and construction and method of operation may be made without departing from the spirit of the invention.

What is claimed is:

1. A low inductance capacitor mounting structure for capacitors of a printed circuit board, comprising:
   a solder pad layer for mounting a capacitor thereon;
   an upper electrically conductive layer providing a voltage plane;
   a lower electrically conductive layer provided closely below said upper electrically conductive layer and providing a voltage plane;
   a first substrate dielectric layer provided between said solder pad layer and said upper electrically conductive layer;
   a first set of vias formed through said first substrate dielectric layer and electrically connecting said solder pad layer and said upper electrically conductive layer;
   a second substrate dielectric layer provided between said upper electrically conductive layer and said lower electrically conductive layer; and
   a second set of vias formed through said first substrate dielectric layer and said second substrate dielectric layer and electrically connecting said solder pad layer and said lower electrically conductive layer;
   said lower electrically conductive layer being positioned closely below said upper electrically conductive layer to confine a magnetic field path generated by said second set of vias between said upper electrically conductive layer and said lower electrically conductive layer thereby reducing inductance between said upper electrically conductive layer and said lower electrically conductive layer; and
   wherein the spacing between said upper electrically conductive layer and said lower electrically conductive layer is substantially less than 15 mils.

2. The low inductance capacitor mounting structure of claim 1, wherein the spacing between said upper electrically conductive layer and said lower electrically conductive layer is less than 10 mils.

3. The low inductance capacitor mounting structure of claim 1, wherein the spacing between said upper electrically conductive layer and said lower electrically conductive layer is less than 5 mils.

4. The low inductance capacitor mounting structure of claim 1, wherein said first set of vias and said second set of vias be in position to confine a magnetic field path between said first set of vias and said second set of vias thereby reducing inductance between said first set of vias and said second set of vias.

5. The low inductance capacitor mounting structure of claim 4, wherein the spacing between said upper electrically conductive layer and said lower electrically conductive layer is on the order of than 2–3 mils.

6. The low inductance capacitor mounting structure of claim 4, wherein the inductance of segments of said second set of vias between said upper electrically conductive layer and said lower electrically conductive layer is on the order of 0.5 nH.

7. The low inductance capacitor mounting structure of claim 4, wherein the inductance of segments of said second set of vias or a second slot between said upper electrically conductive layer and said lower electrically conductive layer is less than 0.1 nH.

8. The low inductance capacitor mounting structure of claim 4, wherein said upper electrically conductive layer and said lower electrically conductive layer are separated only by said second substrate dielectric layer.

9. The low inductance capacitor mounting structure of claim 4, said solder pad layer comprising:
   a first solder pad coupled to said first set of vias and serving as a first capacitor terminal; and
   a second solder pad coupled to said second set of vias and serving as a second capacitor terminal.

10. The low inductance capacitor mounting structure of claim 4, further comprising:
    a capacitor mounted on said solder pad layer.

11. The low inductance capacitor mounting structure of claim 10, the capacitor having a first side edge and a second side edge, wherein said first set of vias and said second set of vias are coupled to portions of said solder pad layer between a vertical plane defined by said first side edge and a vertical plane defined by said second side edge.

12. The low inductance capacitor mounting structure of claim 1, wherein said first set of vias is spaced within 24 mils of said second set of vias.

13. The low inductance capacitor mounting structure of claim wherein the spacing between said first set of vias and said second set of vias is on the order of 15 mils.

14. A low inductance printed circuit board, comprising:
    a plurality of low inductance capacitor mounting structures for capacitors, each low inductance capacitor mounting structure, comprising:
    a solder pad layer for mounting a capacitor thereon;
    an upper electrically conductive layer providing a voltage plane;
    a lower electrically conductive layer provided closely below said upper electrically conductive layer and providing a voltage plane;
    a first substrate dielectric layer provided between said solder pad layer and said upper electrically conductive layer;
    a first set of vias formed through said first substrate dielectric layer and electrically connecting said solder pad layer and said upper electrically conductive layer;
    a second substrate dielectric layer provided between said upper electrically conductive layer and said lower electrically conductive layer;
    a second set of vias formed through said first substrate dielectric layer and said second substrate dielectric layer and electrically connecting said solder pad layer and said lower electrically conductive layer;
    said lower electrically conductive layer being positioned closely below said upper electrically conductive layer to confine a magnetic field path generated by said second set of vias between said upper electrically conductive layer and said lower electrically conductive layer thereby reducing inductance between said upper electrically conductive layer and said lower electrically conductive layer;
    a plurality of capacitors, each capacitor mounted on said solder pad layer of a low inductance capacitor mounting structure of said plurality of low inductance capacitor mounting structures; and
    wherein the spacing between said upper electrically conductive layer and said lower electrically conductive layer is substantially less than 15 mils.

15. The low inductance printed circuit board of claim 14, wherein the spacing between said upper electrically conductive layer and said lower electrically conductive layer is less than 5 mils.

16. The low inductance printed circuit board of claim 14, wherein the spacing between said upper electrically conductive layer and said electrically conductive layer is on the order of 2–3 mils.

17. The low inductance printed circuit board of claim 14, wherein the inductance of each low inductance capacitor mounting structure is on the order of 0.5 nH.

18. The low inductance printed circuit board of claim 14, wherein the inductance of said second set of vias between said upper electrically conductive layer and said lower electrically conductive layer is less than 0.1 nH.

19. The low inductance printed circuit board of claim 14, wherein said upper electrically conductive layer and said lower electrically conductive layer are separated only by said second substrate dielectric layer.

20. The low inductance printed circuit board of claim 14, said solder pad layer comprising:
    said first set of vias and serving as a first capacitor terminal; and
    a second set of solder pads coupled to said second set of vias and serving as a second capacitor terminal.

21. The low inductance printed circuit board of claim 14, wherein the spacing between said upper electrically conductive layer and said lower electrically conductive layer is less than 10 mils.

22. The low inductance printed circuit board of claim 15, the capacitor having a first side edge and a second side edge, wherein said first set of vias and said second set of vias are coupled to portions of said solder pad layer between a vertical plane defined by said first side edge and a vertical plane defined by said second side edge.

23. The low inductance printed circuit board of claim 14, wherein said first set of vias and said second set of vias be in position to confine a magnetic field path between said first set of vias and said second set of vias thereby reducing inductance between said first set of vias and said second set of vias.

24. The low inductance printed circuit board of claim 14, wherein said first set of vias is spaced within 24 mils of said second set of vias.

25. The low inductance printed circuit board of claim 14, wherein the spacing between said first set of vias and said second set of vias is on the order of 15 mils.

26. A low inductance capacitor mounting structure for capacitors of a printed circuit board, the capacitor mounting structure including a solder pad layer for mounting a capacitor thereon, an upper electrically conductive layer providing a voltage plane, a first substrate dielectric layer provided between the solder pad layer and the upper electrically conductive layer, a first set of vias or a first slot formed through the substrate dielectric layer and electrically connecting the solder pad layer and the upper electrically conductive layer, a second substrate dielectrical layer provided between the upper electrically conductive layer and a lower electrically conductive layer, and a second set of vias or a second slot formed through the first substrate dielectric layer and electrically connecting the solder pad layer and the lower electrically conductive layer, comprising:
    said lower electrically conductive layer being spaced closely below said upper electrically conductive layer;
    said upper electrically conductive layer and said lower electrically conductive layer forming a first set of spaces near the first set of vias or the first slot formed by providing said lower electrically conductive layer closely below said upper electrically conductive layer;
    said upper electrically conductive layer and said lower electrically conductive layer being spaced from each other near the second set of vias or the second slot formed by providing sail lower electrically conductive layer closely below said upper electrically conductive layer;

said lower electrically conductive layer being provided closely below said upper electrically conductive layer to define return paths for current in either of said electrically conductive layers with displacement current across a first set of space formed by said upper electrically conductive layer and said lower electrically conductive layer near the first set of vias or the first slot and a second set of spaces formed by said upper electrically conductive layer and said lower electrically conductive layer near the second set of vias or the second slot thereby reducing the dynamic impedance between said electrically conductive layers; and wherein the spacing between said upper electrically conductive layer and said lower electrically conductive layer is substantially less than 15 mils.

27. The low inductance capacitor mounting structure of claim 26, one electrically conductive layer being a source layer and the other electrically conductive layer being a destination layer, wherein the dynamic impedance between the source and destination layer is on the order of 50 milliohms.

28. The low inductance capacitor mounting structure of claim 26, wherein the spacing between said upper electrically conductive layer and said lower electrically conductive layer is less than 3 mils.

29. The low inductance capacitor mounting structure of claim 26, wherein the spacing between said upper electrically conductive layer and said lower electrically conductive layer is less than 3 mils.

30. The low inductance capacitor mounting structure of claim 26, wherein said upper electrically conductive layer and said lower electrically conductive layer are separated only by said second substrate dielectric layer.

31. The low inductance capacitor mounting structure of claim 26, wherein the return paths allow a charge on said lower electrically conductive layer to travel to said upper electrically conductive layer within less than 300 picoseconds thereby reducing the impedance of said upper electrically conductive layer.

32. The low inductance capacitor mounting structure of claim 26, wherein the return paths allow a charge on said upper electrically conductive layer to travel to said lower electrically conductive layer within less than 300 picoseconds thereby reducing the impedance of said lower electrically conductive layer.

33. A low impedance printed circuit board, comprising:

a plurality of low inductance capacitor mounting structures for capacitors of a printed circuit board, each low inductance capacitor mounting structure including a solder pad layer for mounting a capacitor thereon, an upper electrically conductive layer providing a voltage plane, a lower electrically conductive layer spaced below the upper electrically conductive layer and providing a voltage plane, a first substrate dielectric layer provided between the solder pad layer and the upper electrically conductive layer, a first set of vias or a first slot formed through the first substrate dielectric layer and dialectically connecting the solder pad layer and the upper electrically conductive layer, a second substrate dielectric layer provided between the upper electrically conductive layer and said lower electrically conductive layer, and a second set of vias or a second slot formed thorough the first substrate dielectric layer and electrically connecting the solder pad layer and the lower electrically conductive layer, comprising:

said upper electrically conductive layer and said lower electrically conductive layer forming a first set of spaces near said first set of vias or said first slot formed by providing said lower electrically conductive layer closely below said upper electrically conductive layer;

said upper electrically conductive layer and said lower electrically conductive layer forming a second set of spaces near said second set of vias or said second slot formed by providing said lower electrically conductive layer closely below said upper electrically conductive layer; and said lower electrically conductive layer being provided closely below said upper electrically conductive layer to define return paths for current in one of said electrically conduct layers with displacement current across a first set of spaces formed by said upper electrically conductive layer and said lower electrically conductive layer near the first set of vias or the first slot and a second set of spaces formed by said upper electrically conductive layer and said lower electrically conductive layer near the second set of vias or the second slot thereby reducing a dynamic impedance between the electrically conductive layers; and wherein the spacing between said upper electrically conductive layer and said lower electrically conductive layer is substantially less than 15 mils.

34. The low impedance printed circuit board of claim 33, one electrically conductive layer being a source layer and the other electrically conductive layer being a destination layer, wherein the dynamic impedance between the electrically conductive layers is on the order of 50 milliohms.

35. The low impedance printed circuit board of claim 33, wherein the spacing between said upper electrically conductive layer and said lower electrically conductive layer is less than 10 mils.

36. The low impedance printed circuit board fo claim 33, wherein said upper electrically conductive layer and said lower electrically conductive layer is less than 3 mils.

37. The low impedance printed circuit board of claim 33, wherein said upper electrically conductive layer and said lower electrically conductive layer are separated only by said second substrate dielectric layer.

38. The low impedance printed circuit board of claim 33, wherein the return paths allow a charge on said lower electrically conductive layer to travel to said upper electrically conductive layer within less than 300 picoseconds thereby reducing the impedance between the electrically conductive layers.

39. The low impedance printed circuit board of claim 33, wherein the return paths allow a charge on said upper electrically conductive layer to travel to said lower electrically conductive layer within less than 300 picoseconds thereby reducing the impedance of sail lower electrically conductive layer.

40. The low inductance printed circuit board of claim 33, wherein said first set of vias and said second set of vias be in position to confine a magnetic field path between said first set of vias and said second set of vias thereby reducing inductance between said first set of vias and said second set of vias.

41. The low inductance printed circuit board of claim 33, wherein said first set of vias is spaced within 24 mils of said second set of vias.

42. The low inductance printed circuit board of claim 33, wherein the spacing between said first set of vias and said second set of vias is on the order of 15 mils.

* * * * *

UNITED STATES PATENT AND TRADEMARK OFFICE
CERTIFICATE OF CORRECTION

PATENT NO. : 6,252,177 B1
DATED : June 26, 2001
INVENTOR(S) : D. Joe Stoddard

It is certified that error appears in the above-identified patent and that said Letters Patent is hereby corrected as shown below:

Column 10,
Lines 60 and 64, delete "4" and insert -- 1 --.

Column 11,
Lines 2, 7, 11 and 16, delete "4" and insert -- 1 --.
Line 27, after "claim" insert -- 1, --.

Column 12,
Line 28, delete "15" and insert -- 14 --.

Column 13,
Line 2, delete "sail" and insert -- said --.
Line 30, delete "3 mils" and insert -- 10 mils. --.
Line 62, delete "dialectically" and insert -- electrically --.

Signed and Sealed this

Twenty-eighth Day of February, 2006

JON W. DUDAS
*Director of the United States Patent and Trademark Office*